(12) United States Patent
Hayashi et al.

(10) Patent No.: US 7,037,380 B2
(45) Date of Patent: May 2, 2006

(54) METHOD FOR CLEANING CHAMBER OF DEPOSITION APPARATUS FOR ORGANIC EL DEVICE PRODUCTION

(75) Inventors: Nobuya Hayashi, Tokyo (JP); Shinichiro Narui, Tokyo (JP); Hidekazu Okamoto, Kanagawa (JP); Masaaki Tsuzaki, Chiba (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 11/012,293

(22) Filed: Dec. 16, 2004

(65) Prior Publication Data

US 2005/0155632 A1    Jul. 21, 2005

Related U.S. Application Data

(63) Continuation of application No. PCT/JP03/07773, filed on Jun. 19, 2003.

(30) Foreign Application Priority Data

Jun. 19, 2002    (JP) ............................. 2002-178471

(51) Int. Cl.
 *B08B 9/00*    (2006.01)
(52) U.S. Cl. .................... 134/10; 134/22.1; 134/22.19; 134/24; 134/25.4; 252/366; 252/301.16; 252/364; 252/508
(58) Field of Classification Search ................ 134/107, 134/22.1, 22.19, 24, 25.4, 10; 252/366, 301.16, 252/364, 508
See application file for complete search history.

(56) References Cited

U.S. PATENT DOCUMENTS

| | | | |
|---|---|---|---|
| 4,530,776 A | | 7/1985 | Hisamoto et al. |
| 2002/0009037 A1 | | 1/2002 | Tamada |

FOREIGN PATENT DOCUMENTS

| | | |
|---|---|---|
| JP | 59-157196 | 9/1984 |
| JP | 2-261900 | 10/1990 |
| JP | 6-211718 | 8/1994 |
| JP | 6-346095 | 12/1994 |
| JP | 7-64284 | 3/1995 |
| JP | 2000-353593 | 12/2000 |
| JP | 2001-015267 | 1/2001 |
| JP | 2001-185364 | 7/2001 |
| JP | 2002-151260 | 5/2002 |

*Primary Examiner*—Zeinab El-Arini
(74) *Attorney, Agent, or Firm*—Oblon, Spivak, McClelland, Maier & Neustadt, P.C.

(57) ABSTRACT

A compound such as $Alq_3$ accumulated on the inner surface of a chamber at the time of organic EL device production and wasted is recovered and recycled, whereby the production cost is reduced. The inner surface of a chamber or the surface of components in the chamber to which a compound such as $Alq_3$ has adhered is cleaned with a fluorinated alcohol such as 2,2,3,3,4,4,5,5-octafluoropentanol to recover $Alq_3$.

20 Claims, No Drawings

METHOD FOR CLEANING CHAMBER OF DEPOSITION APPARATUS FOR ORGANIC EL DEVICE PRODUCTION

TECHNICAL FIELD

The present invention relates to a method for cleaning a chamber of a deposition apparatus for organic EL (electrolumenescene) device production.

BACKGROUND ART

In production of an organic EL device, as a method for forming a thin film of an organic compound (hereinafter sometimes referred to as a material), a vacuum deposition method has been known. The vacuum deposition method is a method of forming a thin film by property combining an evaporation source and a substrate for deposition in a vacuum chamber, and has such an advantage that a homogeneous thin film is likely to be obtained as compared with a wet process such as a spin coat method or a dip method. As the vacuum deposition method, e.g. a resistance heating deposition method in which a material is made to adhere to a metal container (metal board) having a relatively high electrical resistance and an electric current is applied to the metal container, whereby the metal container is made to generate heat and the material is evaporated, to form a thin film of the material on the surface of a substrate for deposition, and an electron beam/laser beam deposition method in which a material is irradiated with an electron beam or a laser beam, whereby the material is evaporated by the energy of the beam to form a thin film of the material on the surface of a substrate for deposition, have been known. Particularly, the resistance heating deposition method is widely used since the structure of the deposition apparatus is simple, and formation of a high quality thin film can be realized at a low cost.

In the case of an apparatus used for the above deposition method, part of the evaporated material is deposited on the surface of a substrate for an organic EL device, and the remainder is accumulated on the inner surface of a chamber of the deposition apparatus or on the surface of components disposed in the chamber. Accordingly, the material to form the thin film on the surface of the substrate for an organic EL device is part of the entire material, and the most part adheres to e.g. the inner surface of the chamber and is wasted without being utilized. An expensive compound is used for the material of an organic EL device in many cases, and thus the production cost of the device tends to be high if the material cannot efficiently be used. Further, when the chamber is used for deposition of another material, the material accumulated on the inner surface of the chamber may be contained as an impurity in the film, whereby the film may be contaminated.

In order to overcome the above problems, the present inventors have conducted extensive studies on a method of cleaning an organic compound which has adhered to the inner surface of a chamber of a deposition apparatus or to the surface of components disposed in the chamber, with an organic solvent, and recovering the organic compound.

To carry out the above method, it is considered to be necessary to carry out cleaning by using an organic solvent which provides a solubility of the above organic compound to a certain extent. However, an organic solvent in which a compound generally used as a material for production of an organic EL device is soluble is limited.

For example, as the above organic compound, aluminum tris(8-hydroxyquinolinate) (hereinafter referred to as $Alq_3$) may be mentioned. As an organic solvent in which $Alq_3$ is soluble, chloroform has been known. However, a hydrochlorocarbon such as chloroform has high ozone depletion potential.

It is an object of the present invention to provide a method for cleaning a chamber of a deposition apparatus for organic EL device production, which reduces the production cost by recycling a material accumulated on the inner surface of the chamber at the time of organic EL device production and wasted, which prevents inclusion of the material accumulated on the inner surface of the chamber as an impurity in a thin film as a product, and which is free from environmental problems such as ozone depletion.

DISCLOSURE OF THE INVENTION

The present invention provides a method for cleaning a chamber of a deposition apparatus for organic EL device production in which a compound consisting of a metal complex of 8-hydroxyquinoline or its derivative is deposited on the surface of a substrate, the method comprising a step of cleaning the inner surface of the chamber or the surface of components disposed in the chamber, to which the above compound has adhered when the above compound has been deposited on the surface of the substrate, with a fluorinated alcohol to remove the adhering compound, and a step of recovering the fluorinated alcohol containing the above compound.

BEST MODE FOR CARRYING OUT THE INVENTION

In the present invention, the inner surface of a chamber or the surface of components disposed in the chamber, to which a compound consisting of a metal complex of 8-hydroxyquinoline or its derivative has adhered when the compound has been deposited on the surface of a substrate, is cleaned.

As the above compound, specifically, $Alq_3$ (aluminum tris(8-hydroxyquinolinate)), $Almq_3$ (a derivative having an electron donative methyl group introduced to $Alq_3$), $Alph_3$ (benzoquinolinol aluminum complex), $Znq_2$ (four-coordinate complex of 8-hydroxyquinoline with Zn) or $BAlq_1$ may, for example, be mentioned.

In the present invention, a fluorinated alcohol is used as the cleaning solvent. The fluorinated alcohol has such advantages that it provides excellent solubility of $Alq_3$, it is incombustible or flame retardant and is easily handled, and it has substantially no influences over components constituting the deposition apparatus for organic EL device production made of e.g. a plastic or a metal.

The fluorinated alcohol used in the present invention may, for example, be a compound represented by the formula 1:

$$R^f CHX\text{—}OH \qquad \text{formula 1}$$

wherein X is a hydrogen atom, a fluorine atom or a trifluoromethyl group, and $R^f$ is a fluorine atom or a $C_{1-4}$ polyfluoroalkyl group. The polyfluoroalkyl group is a group having at least two hydrogen atoms of an alkyl group substituted by fluorine atoms. The polyfluoroalkyl group may have a linear structure or a branched structure.

As specific examples of the compound represented by formula 1, the following compounds may, for example, be mentioned.

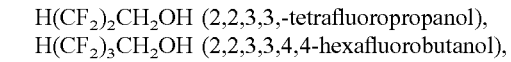

$H(CF_2)_2CH_2OH$ (2,2,3,3,-tetrafluoropropanol),
$H(CF_2)_3CH_2OH$ (2,2,3,3,4,4-hexafluorobutanol), H(CF$_2$)$_4$CH$_2$OH (2,2,3,3,4,4,5,5-octafluoropentanol) and (CF$_3$)$_2$CHOH (1,1,1,3,3,3-hexafluoroisopropanol).

These compounds are preferred in view of particularly excellent solubility of Alq$_3$.

Further, the fluorinated alcohol in the present invention is preferably one having a solubility parameter (value δ) of at least 8 and at most 20, particularly preferably at least 9 and at most 15, furthermore preferably at least 10 and at most 12. For example, the solubility parameters (values δ) of the compounds represented by the above formula 1 are as follows.

TABLE 1

| Compound | Value δ |
|---|---|
| H (CF$_2$)$_2$CH$_2$OH | 11.3 |
| H (CF$_2$)$_3$CH$_2$OH | 10.0 |
| (CF$_3$)$_2$CHOH | 9.6 |

In the present invention, the fluorinated alcohol may be used alone or as a mixture of at least two of them.

The deposition apparatus to be used for production of an organic EL device, to which the cleaning method of the present invention can be applied, may be a vacuum deposition apparatus such as a resistance heating deposition apparatus, an electron beam deposition apparatus or a laser beam deposition apparatus. Particularly, the cleaning method of the present invention is considered to be effective when used for cleaning of a resistance heating deposition apparatus. In the chamber of a deposition apparatus, components such as an evaporation source of an organic compound, a thickness sensor, a substrate-holding mechanism and a metal shadow mask are disposed, and these components are objects of cleaning.

Now, the procedure to carry out the cleaning method of the present invention will be specifically explained.

In a step of forming a thin film of a compound consisting of a metal complex of 8-hydroxyquinoline or its derivative, the above compound is evaporated from the evaporation source in the chamber of the deposition apparatus. The evaporated compound adheres to a substrate for production of an organic EL device and at the same time, adheres to the inner surface of the chamber and to the surface of the components disposed in the chamber.

A fluorinated alcohol is brought into contact with the inner surface of the chamber and the surface of the components to which the above compound has adhered, to remove the above compound. As the removal method, a method of ejecting the fluorinated alcohol from e.g. a spray nozzle and spraying it on the inner surface of the chamber and the surface of the components may be mentioned.

Then, the obtained fluorinated alcohol containing the above compound is recovered.

The recovered fluorinated alcohol containing the above compound is separated into the above compound and the fluorinated alcohol. As the separation method, a method of evaporating the organic solvent under normal pressure or under reduced pressure may be mentioned.

The separated and recovered compound is preferably purified to a purity with which it can be used again as a material for formation of a thin film of an organic EL device. As the purification method, a purification method such as purification by recrystallization, purification by liquid chromatography, purification by sublimation may be mentioned. Purification is carried out preferably in a clean room or in a dark cold place. The above compound may further be subjected to an operation of extracting impurities under reflux with methanol and removing them, after purification.

Now, the cleaning method of the present invention will be specifically explained below. However, the present invention is by no means restricted thereto.

Step 1: A fluorinated alcohol is ejected from a spray nozzle disposed in a chamber of a deposition apparatus used for production of an organic EL device, to clean the inner surface of the chamber and the surface of components in the chamber to which Alq$_3$ had adhered.

Step 2: The fluorinated alcohol containing Alq$_3$ is drawn out from the bottom of the chamber and recovered in a recovery tank.

Step 3: The recovered fluorinated alcohol containing Alq$_3$ is exposed to a vacuum to evaporate the fluorinated alcohol, so that Alq$_3$ is concentrated and separates out.

Step 4: The Alq$_3$ which separated out is dissolved in a solvent which provides a moderate dissolution property of Alq$_3$, such as methylene chloride, to obtain an Alq$_3$ solution.

Step 5: The Alq$_3$ solution is cooled so that the dissolved Alq$_3$ separates out. The cooling temperature is preferably from −30° C. to 20° C., more preferably from −15° C. to 18° C. The cooling time is preferably from 30 minutes to 2 hours, more preferably from 45 minutes to one and a half hours.

Step 6: The Alq$_3$ which separated out is subjected to filtration and dried to recover Alq$_3$. The drying temperature is preferably from 40 to 60° C., more preferably from 45° C. to 55° C. The drying time is preferably from 10 to 40 hours, more preferably from 12 to 35 hours.

EXAMPLES

Example 1

The solubility of Alq$_3$ in a fluorinated alcohol was confirmed by the following method.

A mixed liquid obtained by mixing 1 mg of Alq$_3$ and 3 ml of H(CF$_2$)$_4$CH$_2$OH was prepared at 25° C. The mixture state was visually confirmed, whereupon it was confirmed that Alq$_3$ was completely dissolved.

Example 2

On the inner surface of a chamber of an organic thin film formation apparatus and on the surface of components such as a mask, to which aluminum tris(8-hydroxyquinolinate) (Alq$_3$) as a material for an organic EL device has adhered, which has adhered to the inner surface of the chamber of the organic thin film formation apparatus and the surface of a component such as a mask, H(CF$_2$)$_4$CH$_2$OH (2,2,3,3,4,4,5, 5-octafluoropentanol, hereinafter referred to as OFPO) is sprayed from a spray nozzle in the deposition apparatus at 500 mL/min for 5 minutes, to clean the interior of the chamber of the organic thin film formation apparatus. OFPO used for cleaning i.e. OFPO containing Alq$_3$ (hereinafter referred to as an OFPO solution) is drawn out from the bottom of the organic thin film formation apparatus into a recovery tank disposed at a lower part of the organic thin film formation apparatus and recovered. From the recovered OFPO solution, OFPO is evaporated under 130 hPa at 80° C. The residue after evaporation of OFPO is dissolved in 10 mL of methylene chloride at 30° C. to prepare a methylene chloride solution. The methylene chloride solution is cooled to −10° C. and left to stand for 1 hour. A compound which separates out is subjected to filtration and dried to obtain Alq$_3$. The recovered Alq$_3$ has a purity with which it can be used as a material for formation of a thin film layer of an organic EL device.

Example 3

Cleaning of the inner surface of a chamber of an organic thin film formation apparatus and the surface of components such as a mask to which Alq$_3$ has adhered, is carried out in the same manner as in Example 2 except that H(CF$_2$)$_2$CH$_2$OH (2,2,3,3,-tetrafluoropropanol) is used instead of OFPO. By this operation, the above Alq$_3$ can be recovered and recycled.

INDUSTRIAL APPLICABILITY

By recycling a material accumulated on the inner surface of a chamber at the time of organic EL device production and wasted, the production cost can be reduced, and inclusion of the material accumulated on the inner surface of the chamber as an impurity in a thin film as a product can be prevented. Further, the cleaning method of the present invention is free from environmental problems such as ozone depletion.

The entire disclosure of Japanese Patent Application No. 2002-178471 filed on Jun. 19, 2002 including specification, claims and summary is incorporated herein by reference in its entirety.

What is claimed is:

1. A method of cleaning a chamber of a production apparatus used for making an electroluminescence device by depositing a compound consisting of a metal complex of 8-hydroxyquinoline on a surface of a substrate, the method comprising:

cleaning the inner surface of the chamber or a surface of a components disposed in the chamber, to which the compound has adhered when the compound has been deposited on the surface of the substrate, with a fluorinated alcohol to remove the adhered compound, and recovering the fluorinated alcohol containing the compound.

2. The cleaning method according to claim 1, wherein the compound consisting of a metal complex of 8-hydroxyquinoline or its derivative is aluminum tris(8-hydroxyquinolinate).

3. The cleaning method according to claim 1, wherein the fluorinated alcohol is a compound represented by the formula 1:

formula 1 wherein X is a hydrogen atom, a fluorine atom or a trifluoromethyl group, and R$^f$ is a fluorine atom or a C$_{1-4}$ polyfluoroalkyl group.

4. The cleaning method according to claim 1, wherein the solubility parameter of the fluorinated alcohol is at least 8 and at most 20.

5. The cleaning method according to claim 1, wherein the fluorinated alcohol is 2,2,3,3-tetrafluoropropanol, 2,2,3,3,4,4,5,5-octafluoropentanol, 2,2,3,3,4,4-hexafluorobutanol or 1,1,3,3,3-hexafluoroisopropanol.

6. The cleaning method according to claim 1, further comprising:

separating the recovered fluorinated alcohol containing the compound into the compound and the fluorinated alcohol.

7. The cleaning method according to , wherein the fluorinated alcohol is at least one selected from the group consisting of 2,2,3,3-tetrafluoropropanol, 2,2,3,3,4,4,5,5-octafluoropentanol, 2,2,3,3,4,4-hexafluorobutanol and 1,1,3,3,3-hexafluoroisopropanol.

8. The method according to claim 1, wherein the solubility parameter of the fluorinated alcohol is from 9 to 12.

9. The method according to claim 1, wherein the cleaning includes spraying the fluorinated alcohol on the inner surface of the chamber and the surface of the components dispersed therein.

10. The method of claim 1, wherein the recovering includes separating the fluorinated alcohol from the compound by one or more of recrystallization, liquid chromatography and sublimation.

11. A method of cleaning a chamber of a production apparatus used for making an electroluminescence device by depositing a compound consisting of a metal complex of 8-hydroxyquinoline on a surface of a substrate, the method comprising:

contacting a fluorinated alcohol onto one or more of a surface of the chamber and a surface of a component present in the chamber, to dissolve a compound consisting of a metal complex of 8-hydroxyquinoline present on at least one of an inner surface of the chamber and the surface of the component; and recovering the fluorinated alcohol and the compound dissolved therein.

12. The method of claim 11, wherein the compound consists of aluminum tris (8-hydroxyquinolinate).

13. The method of claim 11, wherein the fluorinated alcohol is at least one compound represented by formula 1:

formula 1 wherein X is a hydrogen atom, a fluorine atom or a trifluoromethyl group, and R$^f$ is a fluorine atom or a C$_{1-4}$ polyfluoroalkyl group.

14. The method according to claim 1, wherein the solubility parameter of the fluorinated alcohol is from 8 to 20.

15. The method according to claim 11, wherein the fluorinated alcohol is 2,2,3,3-tetrafluoropropanol, 2,2,3,3,4,4,5,5-octafluoropentanol, 2,2,3,3,4,4-hexafluorobutanol or 1,1,3,3,3-hexafluoroisopropanol.

16. The method according to claim 11, further comprising:

separating the fluorinated alcohol from the compound.

17. The method according to claim 11, wherein the fluorinated alcohol is at least one selected from the group consisting of 2,2,3,3-tetrafluoropropanol, 2,2,3,3,4,4,5,5-octafluoropentanol, 2,2,3,3,4,4-hexafluorobutanol and 1,1,1,3,3-hexafluoroisopropanol.

18. The method of claim 11, wherein the solubility parameter of the fluorinated alcohol is from 9 to 2.

19. 9 The method of claim 11, wherein the contacting includes spraying the fluorinated alcohol onto at least one of the inner surface of the chamber and the surface of the component.

20. The method of claim 11, wherein the recovering includes separating the compound from the fluorinated alcohol by at least one of recrystallization, liquid chromatography and sublimation.

* * * * *